(12) United States Patent
Taguchi et al.

(10) Patent No.: US 12,217,998 B2
(45) Date of Patent: Feb. 4, 2025

(54) SUBSTRATE PROCESSING APPARATUS

(71) Applicant: Tokyo Electron Limited, Tokyo (JP)

(72) Inventors: Junnosuke Taguchi, Iwate (JP); Nobuhiro Takahashi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 428 days.

(21) Appl. No.: 17/128,628

(22) Filed: Dec. 21, 2020

(65) Prior Publication Data

US 2021/0217651 A1    Jul. 15, 2021

(30) Foreign Application Priority Data

Jan. 15, 2020    (JP) .................................. 2020-004495

(51) Int. Cl.
*H01L 21/687*    (2006.01)
*H01L 21/683*    (2006.01)

(52) U.S. Cl.
CPC .... *H01L 21/68764* (2013.01); *H01L 21/6838* (2013.01); *H01L 21/68792* (2013.01)

(58) Field of Classification Search
None
See application file for complete search history.

(56) References Cited

U.S. PATENT DOCUMENTS

| | | | |
|---|---|---|---|
| 6,213,478 B1 * | 4/2001 | Nishikawa | H01L 21/68792 118/503 |
| 6,592,675 B2 * | 7/2003 | Nishikawa | C23C 16/4584 156/345.55 |
| 8,871,066 B2 * | 10/2014 | Dohrmann | H01L 21/68792 204/298.15 |
| 2003/0029384 A1 * | 2/2003 | Nishikawa | C23C 16/4584 156/345.55 |
| 2004/0005731 A1 * | 1/2004 | Jurgensen | C30B 25/14 438/100 |
| 2007/0266935 A1 * | 11/2007 | Lee | H01L 21/67288 118/52 |
| 2011/0114022 A1 * | 5/2011 | Boguslavskiy | H01L 21/68764 118/724 |
| 2012/0267244 A1 * | 10/2012 | Dohrmann | H01L 21/68792 204/298.15 |
| 2016/0083841 A1 * | 3/2016 | Honma | C23C 16/45551 118/728 |
| 2018/0023191 A1 * | 1/2018 | Gangakhedkar | C23C 14/505 269/40 |

FOREIGN PATENT DOCUMENTS

JP    2016-096220    5/2016

* cited by examiner

*Primary Examiner* — Jeffrie R Lund
*Assistant Examiner* — Tiffany Z Nuckols
(74) *Attorney, Agent, or Firm* — IPUSA, PLLC

(57) ABSTRACT

A substrate processing apparatus includes a vacuum chamber, a rotary table that is rotatably provided inside the vacuum chamber, a stage that is rotatable with respect to the rotary table, the stage having a center of rotation at a position spaced apart from a center of rotation of the rotary table, and the stage having a flange provided at a lower surface of the stage, a first holder and a second holder, the flange being sandwiched between the first holder and the second holder, and a pressing member configured to press the second holder in a direction in which the second holder comes closer to the first holder.

16 Claims, 6 Drawing Sheets

SUBSTRATE PROCESSING APPARATUS

CROSS-REFERENCE TO RELATED APPLICATIONS

This patent application is based on and claims priority to Japanese Patent Application No. 2020-004495 filed on Jan. 15, 2020, the entire contents of which are incorporated herein by reference.

TECHNICAL FIELD

The present disclosure relates to an apparatus for substrate processing.

BACKGROUND

An apparatus that deposits various films on wafers by rotating a rotary table on which multiple wafers are placed to cause each wafer to revolve and to repeatedly pass through a supply area of processing gas arranged along a radial direction of the rotary table (e.g., see Patent Document 1) is known. In this apparatus, a stage of the wafer rotates to cause the wafer to rotate while the wafer revolves by rotating the rotary table, so that the uniformity of the film in a circumferential direction of the wafer is improved.

The present disclosure provides a technology that reduces stress generated by deformation due to thermal expansion.

RELATED ART DOCUMENT

Patent Document

[Patent Document 1] Japanese Laid-open Patent Application Publication No. 2016-96220

SUMMARY

According to one aspect of the present disclosure, a substrate processing apparatus includes a vacuum chamber, a rotary table that is rotatably provided inside the vacuum chamber, a stage that is rotatable with respect to the rotary table, the stage having a center of rotation at a position spaced apart from a center of rotation of the rotary table, and the stage having a flange provided at a lower surface of the stage, a first holder and a second holder, the flange being sandwiched between the first holder and the second holder, and a pressing member configured to press the second holder in a direction in which the second holder comes closer to the first holder.

According to at least one embodiment of the present disclosure, stress generated by deformation due to thermal expansion can be reduced.

DETAILED DESCRIPTION OF EMBODIMENTS

Figure 1:
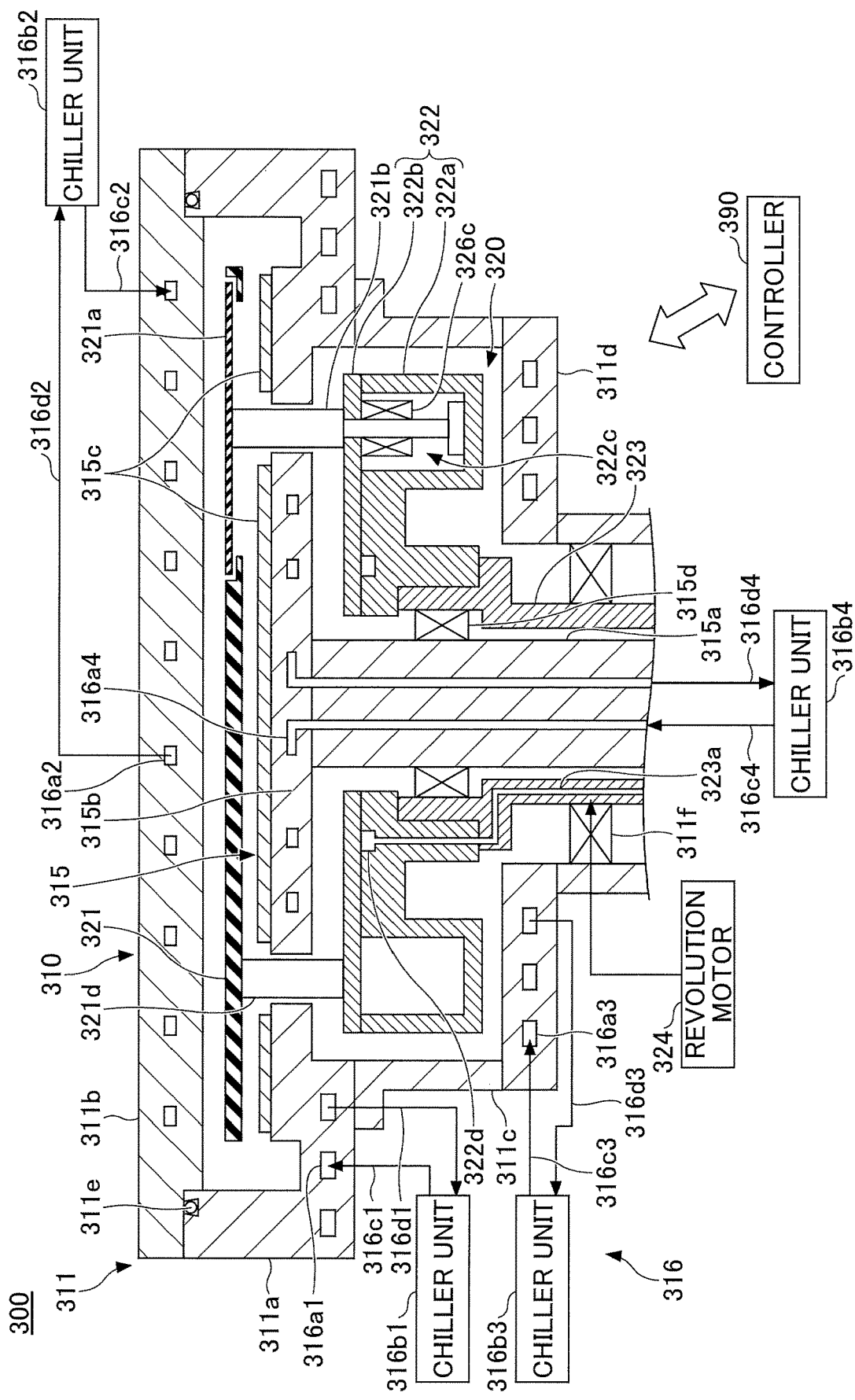
FIG. 1 is a cross-sectional view illustrating an example configuration of a film deposition apparatus.

In the following, an embodiment will be described with reference to the drawings. The present disclosure is not limited to the embodiment. For the same or corresponding members or components in all accompanying drawings, the same or corresponding reference numerals are given and overlapping descriptions are omitted.

[Apparatus for Substrate Processing]

With reference to FIGS. 1 to 4, as an example of an apparatus for substrate processing, a film deposition apparatus 300 that forms a film on a substrate will be described.

Figure 2:
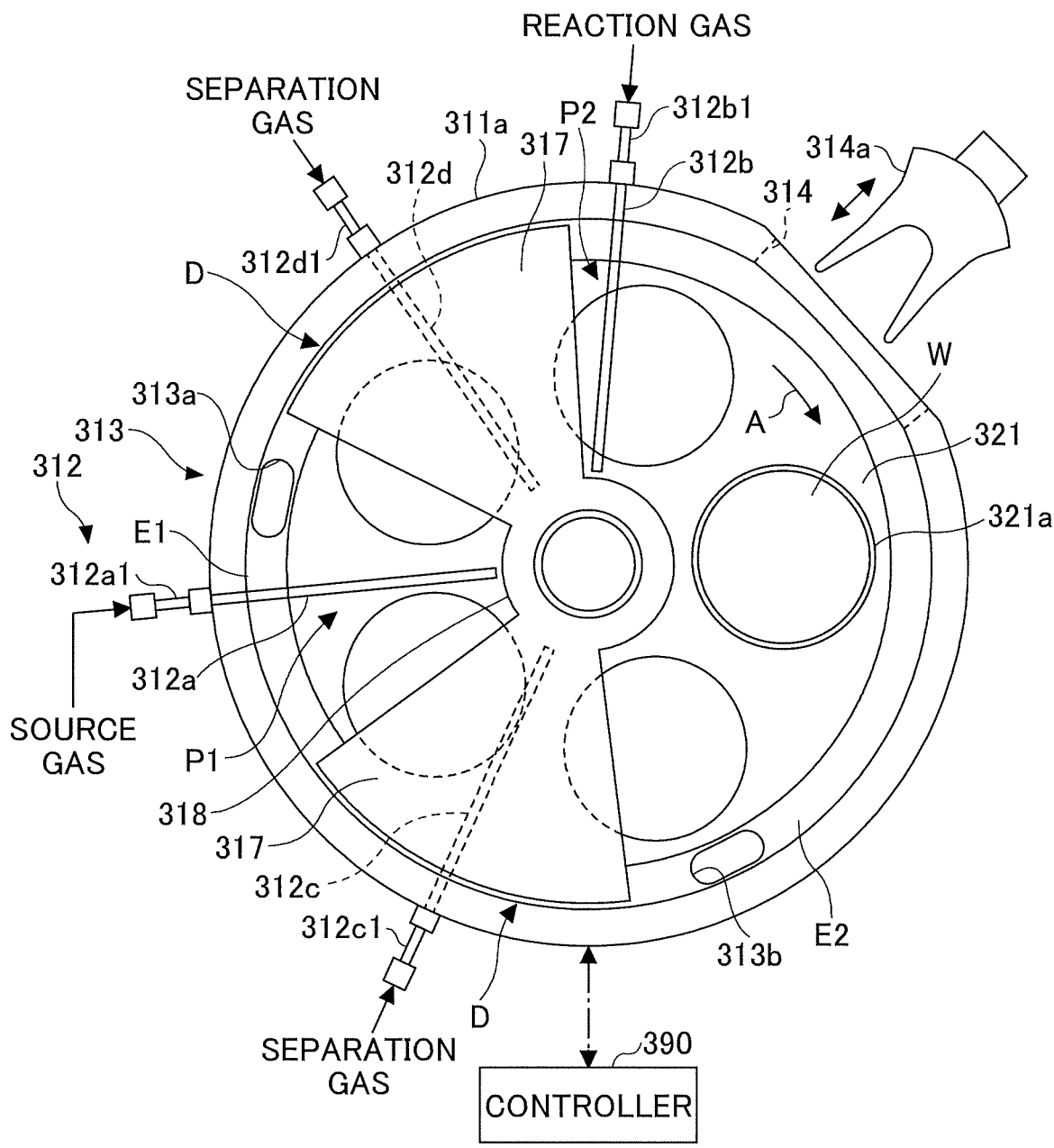
FIG. 2 is a plan view illustrating a configuration inside a vacuum chamber of the film deposition apparatus illustrated in FIG. 1.
Figure 3:
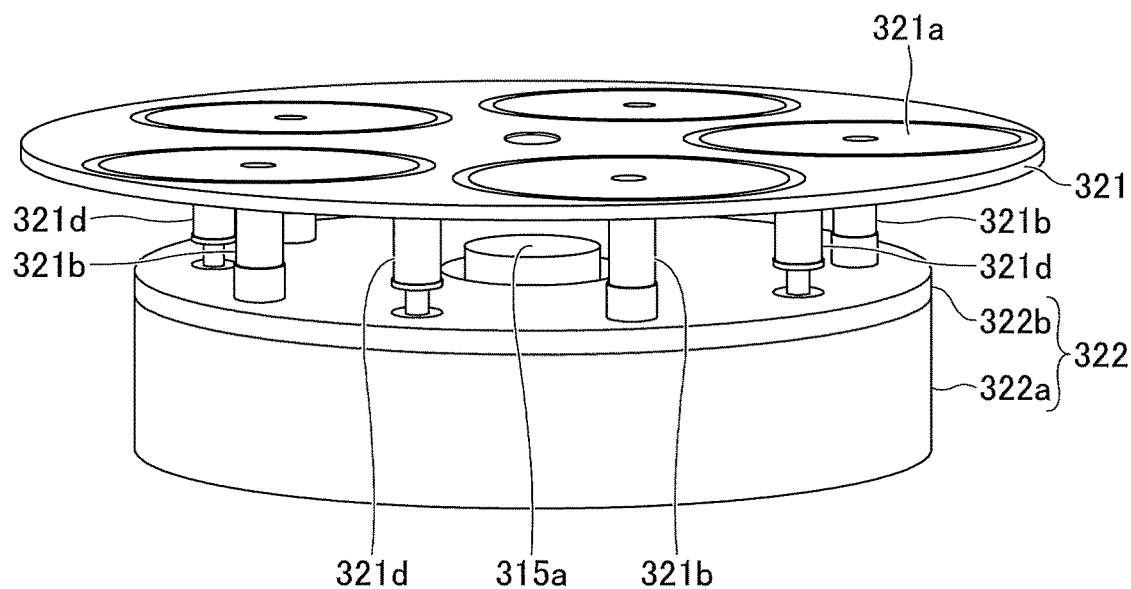
FIG. 3 is a perspective view illustrating a configuration of a rotary table and a stage of the film deposition apparatus illustrated in FIG. 1.
Figure 4:
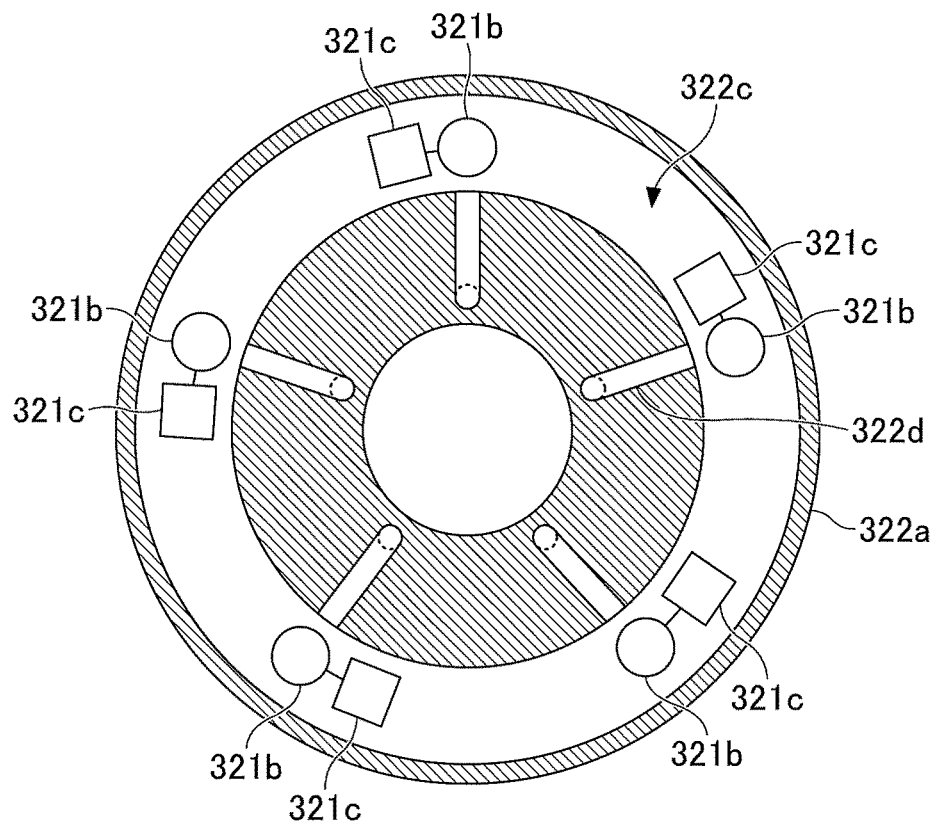
FIG. 4 is a cross-sectional view illustrating a configuration of a housing box of the film deposition apparatus illustrated in FIG. 1.

FIG. 1 is a cross-sectional view illustrating an example configuration of a film deposition apparatus. FIG. 2 is a plan view illustrating a configuration in a vacuum chamber of the film deposition apparatus illustrated in FIG. 1. In FIG. 2, for convenience of explanation, a top plate is not illustrated. FIG. 3 is a perspective view illustrating a configuration of a rotary table and a stage of the film deposition apparatus illustrated in FIG. 1. FIG. 4 is a cross-sectional view illustrating a configuration inside a housing box of the film deposition apparatus illustrated in FIG. 1.

The film deposition apparatus 300 includes a processor 310, a rotation driving device 320, and a controller 390.

The processor 310 is configured to perform a film deposition process that forms a film on a substrate. The processor 310 includes a vacuum chamber 311, a gas introduction port 312, a gas exhaust port 313, a transfer port 314, a heating unit 315, and a cooler 316.

The vacuum chamber 311 is a chamber that can reduce air pressure inside the chamber. The vacuum chamber 311 has a flat and substantially circular planar shape, and accommodates multiple substrates inside the vacuum chamber 311. The substrate may be, for example, a semiconductor wafer. The vacuum chamber 311 includes a body 311*a*, a top plate 311*b*, a side wall body 311*c*, and a bottom plate 311*d* (see FIG. 1). The body 311*a* has a cylindrical shape. The top plate 311*b* is disposed on the upper surface of the body 311*a* through a seal portion 311*e* to be airtight in a removable manner. The side wall body 311*c* is connected to the lower surface of the body 311*a* and has a cylindrical shape. The bottom plate 311*d* is disposed on the bottom surface of the side wall body 311*c* to be airtight.

The gas introduction port 312 includes a source gas nozzle 312*a*, a reaction gas nozzle 312*b*, and separation gas nozzles 312*c* and 312*d* (see FIG. 2). The source gas nozzle 312*a*, the reaction gas nozzle 312*b*, and the separation gas nozzles 312*c* and 312*d* are disposed to be spaced apart from each other in a circumferential direction (i.e., a direction indicated by the arrow A in FIG. 2) of the vacuum chamber 311 over a rotary table 321. In the illustrated example, the separation gas nozzle 312*c*, the source gas nozzle 312*a*, the separation gas nozzle 312*d*, and the reaction gas nozzle 312*b* are arranged clockwise (i.e., in a rotational direction of the rotary table 321) from the transfer port 314 in this order. The gas introduction ports 312*a*1, 312*b*1, 312*c*1, and 312*d*1 (see FIG. 2) that are respectively base ends of the source gas nozzle 312*a*, the reaction gas nozzle 312*b*, the separation gas nozzle 312c, and the separation gas nozzle 312d are fixed to an outer wall of the body 311a. The source gas nozzle 312a, the reaction gas nozzle 312b, and the separation gas nozzles 312c and 312d are introduced from the outer wall of the vacuum chamber 311 into the vacuum chamber 311 and are attached so as to extend horizontally with respect to the rotary table 321 along the radial direction of the body 311a. The source gas nozzle 312a, the reaction gas nozzle 312b, and the separation gas nozzles 312c and 312d are made of, for example, quartz.

The source gas nozzle 312a is connected to a source of the source gas (which is not illustrated) through a pipe, a flow controller, and the like (which are not illustrated). For example, a silicon containing gas or a metal containing gas may be used as the source gas. In the source gas nozzle 312a, multiple exhaust holes (which are not illustrated) that open toward the rotary table 321 are arrayed to be spaced apart from each other along a longitudinal direction of the source gas nozzle 312a. A region under the source gas nozzle 312a is a source gas adsorption region P1 for adsorbing the source gas on a substrate W.

The reaction gas nozzle 312b is connected to a source of the reaction gas (which is not illustrated) through a pipe, a flow controller, and the like (which are not illustrated). For example, oxidizing gas or nitriding gas may be used as the reaction gas. In the reaction gas nozzle 312b, multiple exhaust holes (which are not illustrated) that open toward the rotary table 321 are arrayed to be spaced from each other along a longitudinal direction of the reaction gas nozzle 312b. A region under the reaction gas nozzle 312b is a reaction gas supply region P2 in which the source gas adsorbed on the substrate W in the source gas adsorption region P1 is oxidized or nitrided.

The separation gas nozzles 312c and 312d are both connected to a source of the separation gas (which is not illustrated) through a pipe, a flow control valve, and the like (which are not illustrated). For example, inert gas, such as argon (Ar) gas, nitrogen ($N_2$) gas, or the like, may be used as the separation gas. In the separation gas nozzles 312c and 312d, multiple exhaust holes (which are not illustrated) that open toward the rotary table 321 are arrayed to be spaced apart from each other along a longitudinal direction of the separation gas nozzles 312c and 312d.

Additionally, as illustrated in FIG. 2, two protruding portions 317 are provided in the vacuum chamber 311. The protruding portions 317 are attached to the back surface of the top plate 311b to protrude toward the rotary table 321, so that the protruding portions 317 form separation regions D with the separation gas nozzles 312c and 312d. The protruding portions 317 have a fan-shaped planar shape whose top is cut in an arc shape so that an inner arc is connected to a protrusion 318 and an outer arc is disposed along an inner wall of the body 311a of the vacuum chamber 311.

The gas exhaust port 313 includes a first exhaust port 313a and a second exhaust port 313b (see FIG. 2). The first exhaust port 313a is formed on a bottom of a first exhaust region E1 communicating with the source gas adsorption region P1. The second exhaust port 313b is formed on a bottom of a second exhaust region E2 communicating with the reaction gas supply region P2. The first exhaust port 313a and the second exhaust port 313b are connected to an exhaust device (which is not illustrated) through an exhaust pipe (which is not illustrated).

The transfer port 314 is provided on a side wall of the vacuum chamber 311 (see FIG. 2). In the transfer port 314, the substrate W is transferred between the rotary table 321 in the vacuum chamber 311 and a transfer arm 314a outside the vacuum chamber 311. The transfer port 314 is opened and closed by a gate valve (which is not illustrated).

The heating unit 315 includes a fixing shaft 315a, a heater support 315b and a heater 315c (see FIG. 1).

The fixing shaft 315a has a cylindrical shape having a central axis at the center of the vacuum chamber 311. The fixing shaft 315a is provided inside a rotary shaft 323 to pass through a bottom plate 311d of the vacuum chamber 311. A seal 315d is provided between an outer wall of the fixing shaft 315a and an inner wall of the rotary shaft 323. This causes the rotary shaft 323 to rotate relative to the fixing shaft 315a while maintaining an airtight condition inside the vacuum chamber 311. The seal 315d includes, for example, a magnetic fluid seal.

The heater support 315b is fixed to the top of the fixing shaft 315a and has a disc shape. The heater support 315b supports the heater 315c.

The heater 315c is provided on an upper surface of the heater support 315b. The heater 315c may be provided on the body 311a in addition to the upper surface of the heater support 315b. The heater 315c generates heat when power is supplied from a power source (which is not illustrated) to heat the substrate W.

The cooler 316 includes fluid flow paths 316a1 to 316a4, chiller units 316b1 to 316b4, inlet pipes 316c1 to 316c4, and outlet pipes 316d to 316d4. The fluid flow paths 316a1, 316a2, 316a3, and 316a4 are respectively formed inside the body 311a, the top plate 311b, the bottom plate 311d, and the heater support 315b. The chiller units 316b1 to 316b4 output temperature-controlled fluids. The temperature-controlled fluids output from the chiller units 316b1 to 316b4 flow through the inlet pipes 316c1 to 316c4, the fluid flow paths 316a1 to 316a4, and the outlet pipes 316d to 316d4 in this order, and circulate. This adjusts the temperature of the body 311a, the top plate 311b, the bottom plate 311d, and the heater support 315b. For example, water or a fluorinated fluid such as Galden (registered trademark) may be used as the temperature-controlled fluid.

The rotation driving device 320 includes a rotary table 321, a housing box 322, the rotary shaft 323, and a revolution motor 324.

The rotary table 321 is provided in the vacuum chamber 311 and has a center of rotation at the center of the vacuum chamber 311. The rotary table 321 has a disc shape and is made of quartz, for example. Multiple stages 321a (e.g., five) are provided over the upper surface of the rotary table 321 along the rotational direction (i.e., the circumferential direction). The rotary table 321 is connected to the housing box through a connector 321d.

Each of the stages 321a has a disc shape slightly larger than the substrate W and is made of, for example, quartz. The substrate W is placed on each of the stages 321a. The substrate W may be, for example, a semiconductor wafer. Each of the stages 321a is connected to a rotation motor 321c through a rotating shaft 321b and is configured to be rotatable with respect to the rotary table 321.

The rotating shaft 321b connects the lower surface of the stage 321a to the rotation motor 321c housed inside the housing box 322 to transmit power of the rotation motor 321c to the stage 321a. The rotating shaft 321b is configured to rotate using the center of the stage 321a as a center of rotation. The rotating shaft 321b is provided to pass through a ceiling 322b of the housing box 322 and the rotary table 321. A seal 326c is provided in a through-hole of the ceiling 322b of the housing box 322 to maintain the airtight condition inside the housing box 322. The seal 326c includes, for example, a magnetic fluid seal.

The rotation motor 321c rotates the substrate by rotating the stage 321a through the rotating shaft 321b with respect to the rotary table 321. The rotation motor 321c may be, for example, a servomotor.

The connector 321d connects, for example, the lower surface of the rotary table 321 to the upper surface of the housing box 322. Multiple connectors 321d are provided, for example, along the circumferential direction of the rotary table 321.

The detailed structure of the rotary table 321, the stage 321a, the rotating shaft 321b, and the connector 321d will be described later.

The housing box 322 is provided under the rotary table 321 in the vacuum chamber 311. The housing box 322 is connected to the rotary table 321 through the connector 321d and is configured to rotate integrally with the rotary table 321. The housing box 322 may be configured to move up and down in the vacuum chamber 311 via a lifting mechanism (which is not illustrated). The housing box 322 has a body 322a and a ceiling 322b.

The body 322a is formed in a U-shape in a cross-sectional view and is formed in a ring shape along the rotational direction of the rotary table 321.

The ceiling 322b is provided on the upper surface of the body 322a to cover an opening of the body 322a formed in a U-shape in a cross-sectional view. Thus, the body 322a and the ceiling 322b form a housing portion 322c isolated in the vacuum chamber 311.

The housing portion 322c is formed in a rectangular shape in the cross-sectional view and is formed in a ring shape along the rotational direction of the rotary table 321. The housing portion 322c houses a rotation motor 321c. A communication path 322d that communicates the housing portion 322c to the outside of the film deposition apparatus 300 is formed in the body 322a. This causes the atmospheric air to be introduced into the housing portion 322c from the outside of the film deposition apparatus 300, and the inside of the housing portion 322c is cooled down and maintained at atmospheric pressure.

The rotary shaft 323 is fixed to the bottom of the housing box 322. The rotary shaft 323 is provided to pass through the bottom plate 311d of the vacuum chamber 311. The rotary shaft 323 transmits the power of the revolution motor 324 to the rotary table 321 and the housing box 322 to integrally rotate the rotary table 321 and the housing box 322. A seal 311f is provided in a through-hole of the bottom plate 311d of the vacuum chamber 311 to maintain the airtight condition inside the vacuum chamber 311. The seal 311f includes, for example, a magnetic fluid seal.

A through-hole 323a is formed inside the rotary shaft 323. The through-hole 323a is connected to the communication path 322d of the housing box 322 and functions as a fluid flow path for introducing atmospheric air into the housing box 322. The through-hole 323a also functions as a wiring duct for introducing a power line and a signal line to drive the rotation motor 321c in the housing box 322. For example, the number of the through-holes 323a that are provided is the same as the number of the rotation motors 321c.

The controller 390 controls each unit of the film deposition apparatus 300. The controller 390 may be, for example, a computer. Additionally, a computer program that performs an operation of each unit of the film deposition apparatus 300 is stored in a storage medium. The storage medium may be, for example, a flexible disk, a compact disk, a hard disk, a flash memory, a DVD, or the like.

[Mechanism of Fixing the Stage]

Figure 5A:
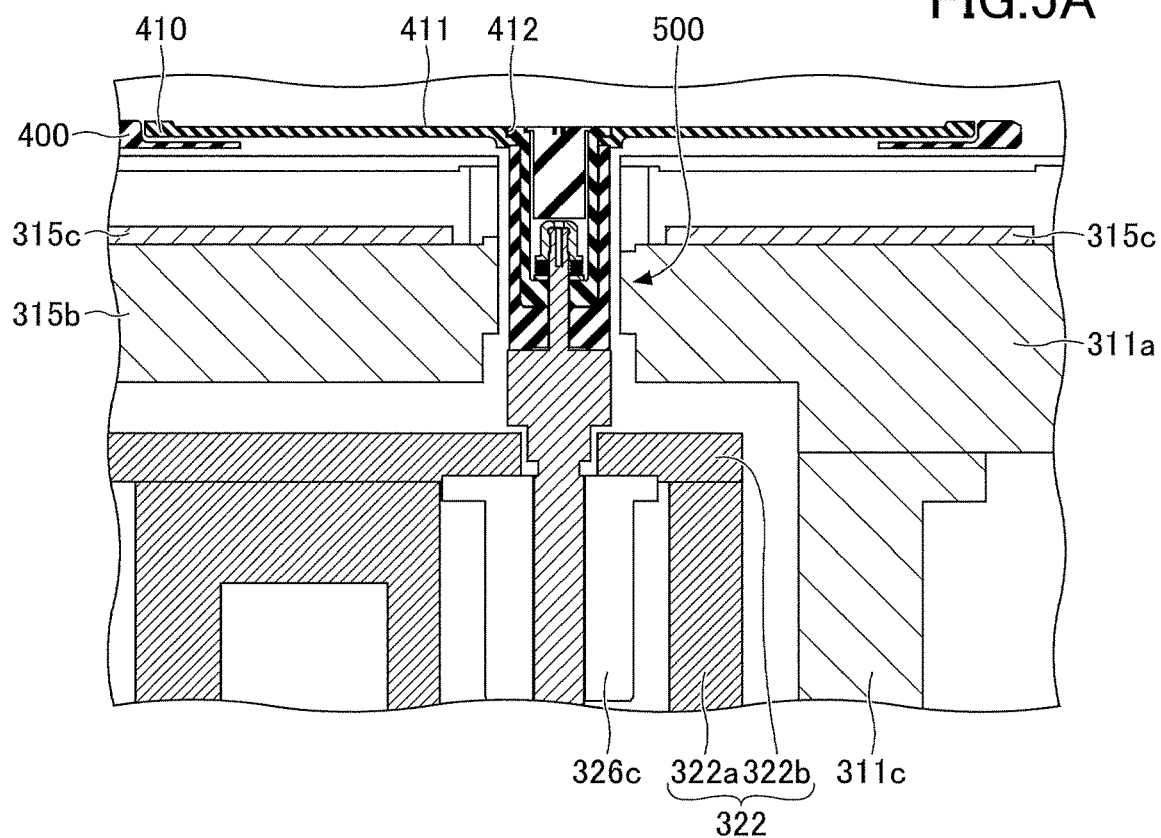
FIG. 5A and FIG. 5B are drawings illustrating an example of a mechanism of fixing the stage.
Figure 5B:
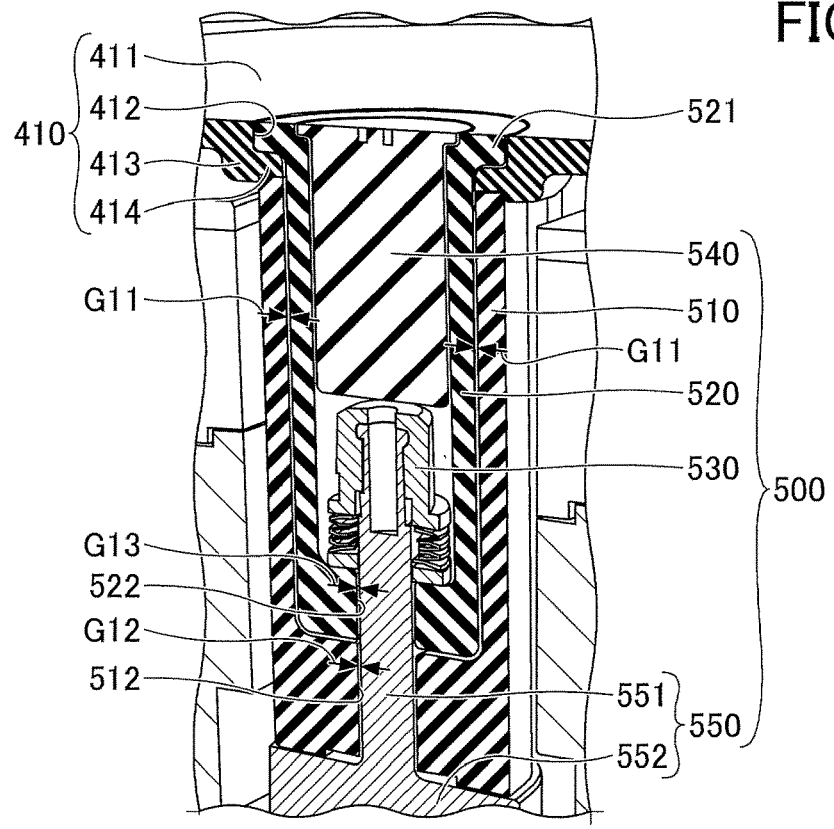

With reference to FIGS. 5A and 5B, an example of a mechanism of fixing the stage 321a in the above-described film deposition apparatus 300 will be described. FIG. 5A and FIG. 5B are drawings illustrating an example of a mechanism of fixing the stage. FIG. 5A is a cross-sectional view illustrating a positional relationship between the stage and a holder, and FIG. 5B is an enlarged view illustrating the holder in FIG. 5A.

First, an example configuration of the stage 321a will be described. Hereinafter, the rotary table 321 and the stage 321a will be described as a rotary table 400 and a stage 410 respectively.

The stage 410 has a center of rotation at a position spaced apart from the center of rotation of the rotary table 400 and is configured to rotate with respect to the rotary table 400. Hereinafter, the center of rotation of the rotary table 400 is referred to as a revolution center, and the center of rotation of the stage 410 is referred to as a rotation center. The revolution center and the rotation center may be, for example, 300 to 400 mm apart. Therefore, when the rotary table 400 rotates, centrifugal force is applied to the stage 410. In particular, when the rotary table 400 rotates at a high speed (e.g., 200 rpm or more), large centrifugal force is applied to the stage 410.

The stage 410 includes a placing portion 411, an opening 412, a thick portion 413, and a flange 414.

The placing portion 411 is a recess formed on the upper surface of the stage 410. The placing portion 411 has an outer diameter slightly larger than the substrate W and has a depth substantially the same as the depth of the substrate W. The substrate W is placed on the placing portion 411.

The opening 412 is formed in the center of rotation of the stage 410. In other words, the opening 412 is formed at a position spaced apart from the center of rotation of the rotary table 400. The opening 412 has a circular shape, for example.

The thick portion 413 is a portion that extends downward from the lower surface of the placing portion 411 around the opening 412 of the stage 410 and has an annular shape.

The flange 414 is a portion protruding from an inner wall of the thick portion 413 toward the center of the opening 412 and has an annular shape. The upper surface of the flange 414 is located below the upper surface of the placing portion 411 of the stage 410.

A fixing mechanism 500 includes a first holder 510, a second holder 520, a pressing member 530, a lid 540, and a shaft 550. The first holder 510, the second holder 520, the pressing member 530, the lid 540, and the shaft 550 function as the above-described rotating shaft 321b.

The first holder 510 has a cylindrical shape with a bottom and is configured such that the upper end of the cylindrical shape contacts the lower surface of the flange 414 of the stage 410. A first through-hole 512 is formed at the bottom of the first holder 510 so that an insertion portion 551 of the shaft 550 can be inserted. The first through-hole 512 has an inner diameter that is slightly larger (e.g., 0.1 to 5.0 mm) than the outer diameter of the insertion portion 551. The first holder 510 is made of a material having a heat resistant temperature higher than the temperature (e.g., 600° C.) of the film deposition process performed in the film deposition apparatus 300, such as quartz or a ceramic.

The second holder 520 is provided inside the first holder 510 with a space G11 spaced from an inner wall of the first holder 510. The space G11 may be, for example, 0.1 to 5.0 mm. The second holder 520 has a cylindrical shape with a bottom that has an outer diameter less than the inner diameter of the first holder 510. The second holder 520 includes a contact 521. The contact 521 has an annular shape extending outward from the outer wall of the upper end of the second holder 520 and contacts the upper surface of the flange 414 formed in the stage 410. A second through-hole 522 is formed at the bottom of the second holder 520 so that the insertion portion 551 of the shaft 550 can be inserted. The second through-hole 522 has an inner diameter slightly larger (e.g., 0.1 to 5.0 mm) than the outer diameter of the insertion portion 551. The second holder 520 is made of a material having a heat resistant temperature higher than the temperature (e.g., 600° C.) of the film deposition process performed in the film deposition apparatus 300, such as quartz or a ceramic. Preferably, the second holder 520 is made of the same material as the first holder 510 with respect to preventing a thermal expansion difference.

As described above, the upper end of the first holder 510 contacts the lower surface of the flange 414 and the contact 521 of the second holder 520 contacts the upper surface of the flange 414 so that the flange 414 is sandwiched by the first holder 510 and the second holder 520.

The pressing member 530 presses the first holder 510 or the second holder 520 in a direction in which the second holder 520 comes closer to the first holder 510. The pressing member 530 is disposed, for example, on a bottom surface inside the second holder 520 to press the bottom of the second holder 520 toward the bottom of the first holder 510. Thus, the flange 414 is sandwiched between the upper end of the first holder 510 and the contact 521 of the second holder 520 and is fixed by the pressing force of the pressing member 530. Thus, this prevents the centrifugal force generated by rotation of the rotary table 400 from causing the stage 410, the second holder 520, and the like to fall toward an outer circumferential side of the rotary table 400. The pressing member 530 includes, for example, a disk spring.

The lid 540 has a cylindrical shape having an outer diameter substantially the same as the inner diameter of the second holder 520 and is inserted into the second holder 520 to cover an upper opening of the second holder 520. This prevents the pressing member 530 from being exposed to the source gas and the reaction gas. Therefore, when the pressing member 530 is made of a metallic material, corrosion of the pressing member 530 can be suppressed. The lid 540 is made of a material, such as quartz or a ceramic, having a heat resistant temperature (e.g., 600° C.) that is higher than the temperature of the film deposition process performed in the film deposition apparatus 300.

The shaft 550 is made of, for example, a metallic material and has an insertion portion 551 and a penetration portion 552.

The insertion portion 551 is an upper portion of the shaft 550. The insertion portion 551 passes through the first through-hole 512 and the second through-hole 522 and an upper end of the insertion portion 551 is fixed by the pressing member 530 inside the second holder 520. Since the outer diameter of the insertion portion 551 is slightly less than the inner diameter of the first through-hole 512, a space G12 is formed between an outer wall of the insertion portion 551 and an inner wall of the first through-hole 512. Since the outer diameter of the insertion portion 551 is slightly less than the inner diameter of the second through-hole 522, a space G13 is formed between the outer wall of the insertion portion 551 and an inner wall of the second through-hole 522.

The penetration portion 552 is a lower portion of the shaft 550. The penetration portion 552 is provided to pass through the ceiling 322b of the housing box 322. A lower end of the penetration portion 552 is located inside the housing box 322. The penetration portion 552 transmits power of the rotation motor 321c (see FIG. 4) disposed inside the housing box 322 to the stage 410 via the first holder 510 and the second holder 520. In other words, when the penetration portion 552 rotates due to the power of the rotation motor 321c, the first holder 510, the second holder 520, and the stage 410 rotate. The insertion portion 551 and the penetration portion 552 may be formed separately.

According to the fixing mechanism 500 described above, the stage 410 is sandwiched between the first holder 510 and the second holder 520, and the pressing member 530 presses the first holder 510 or the second holder 520 in a direction in which the second holder 520 comes closer to the first holder 510 to fix the stage 410. This can absorb a thermal expansion difference in a state in which a rotating core is exposed. As a result, damage of the stage 410, the fixing mechanism 500, and the like caused by thermal stress can be prevented.

Additionally, according to the fixing mechanism 500, the space G12 and the space G13 are respectively formed between the insertion portion 551 and the first through-hole 512 and between the insertion portion 551 and the second through-hole 522. Thus, when thermal expansion differences are generated between the insertion portion 551 and the first holder 510 and between the insertion portion 551 and the second holder 520, generation of stress on the insertion portion 551, the first holder 510, the second holder 520, and the like can be prevented. As a result, damage of the first holder 510, the second holder 520, the stage 410, and the like can be prevented.

Additionally, according to the fixing mechanism 500, the shaft 550 is covered by the first holder 510 and the second holder 520 and fixed by the pressing force of the pressing member 530 disposed on the bottom surface inside the second holder 520. This prevents the shaft 550 from being exposed to the source gas and the reaction gas. As a result, when the shaft 550 is made of a material can be corroded by the source gas and the reaction gas, corrosion of the shaft 550 can be suppressed.

According to the fixing mechanism 500, the shaft 550 is provided to pass through the ceiling 322b of the housing box 322 and is a portion where the lower end of the shaft 550 located inside the housing box 322 is connected to the rotation motor 321c. This allows the rotation motor 321c to be located inside the housing box 322. As a result, a temperature rise of the rotation motor 321c can be suppressed.

[Mechanism of Fixing the Rotary Table]

Figure 6:
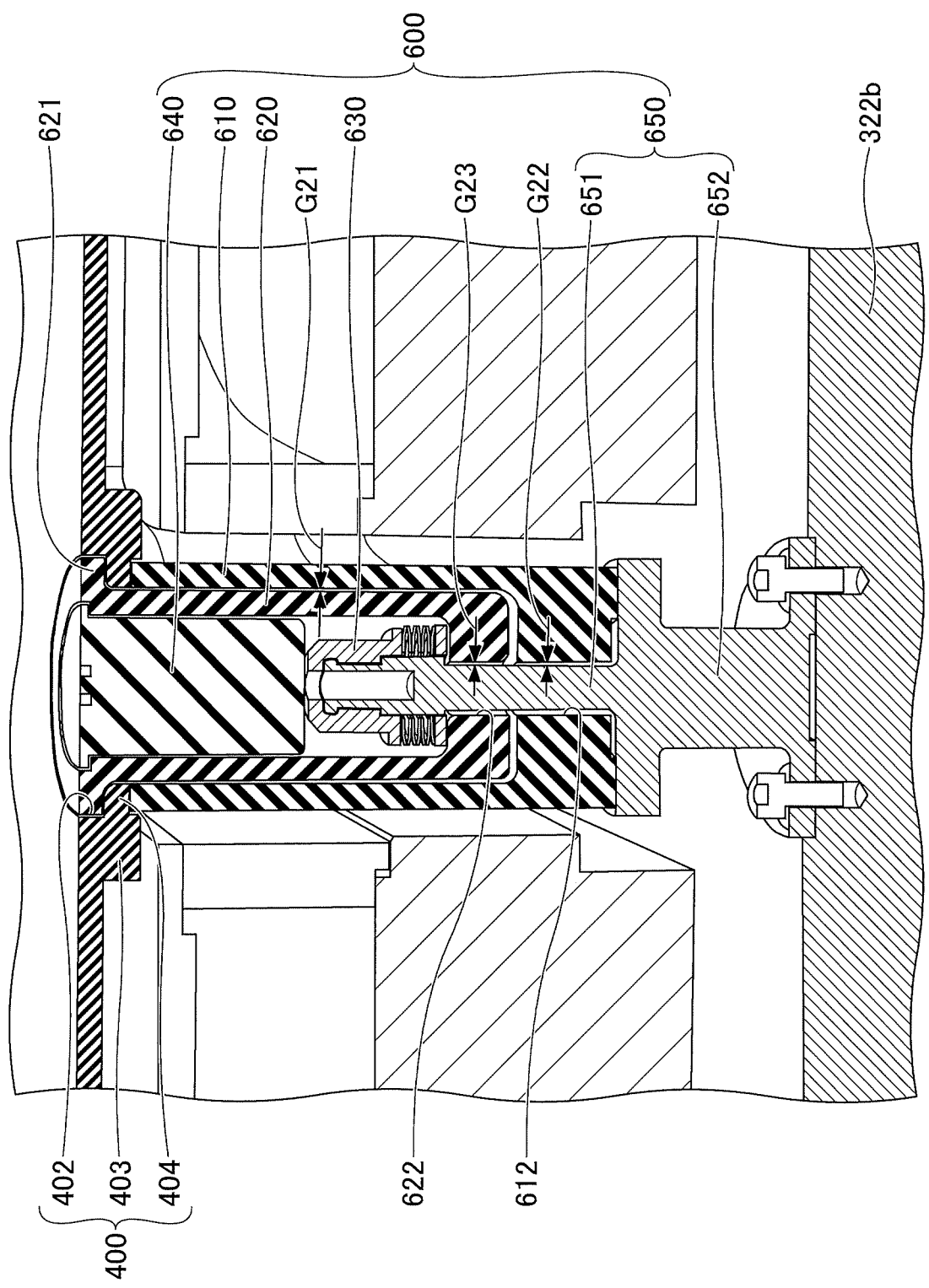
FIG. 6 is a drawing illustrating an example of a mechanism of fixing the rotary table.

With reference to FIG. 6, an example of a mechanism of fixing the rotary table 321 in the above-described film deposition apparatus 300 will be described. FIG. 6 is a drawing illustrating the example of the mechanism of fixing the rotary table.

First, an example configuration of the rotary table 321 will be described. Hereinafter, the rotary table 321 will be described as a rotary table 400.

The rotary table 400 is rotatably provided inside the vacuum chamber 311. The rotary table 400 has an opening 402, a thick portion 403, and a flange 404.

Multiple openings 402 are formed along a circumferential direction of the rotary table 400 at positions spaced apart from the center of rotation of the rotary table 400. The opening 402 has a circular shape, for example.

The thick portion 403 is a portion extending downward from a lower surface of the rotary table 400 around the opening 402 of the rotary table 400 and has an annular shape.

The flange 404 is a portion protruding from an inner wall of the thick portion 403 toward the center of the opening 402 and has an annular shape. The upper surface of the flange 404 is located below the upper surface of the rotary table 400.

The fixing mechanism 600 includes a first holder 610, a second holder 620, a pressing member 630, a lid 640, and a shaft 650. The first holder 610, the second holder 620, the pressing member 630, the lid 640, and the shaft 650 function as the above-described connector 321d.

The first holder 610 has a cylindrical shape with a bottom and is configured such that a cylindrical upper end of the first holder 610 contacts the lower surface of the flange 404 of the rotary table 400. A first through-hole 612 into which the insertion portion 651 of the shaft 650 can be inserted is formed at the bottom of the first holder 610. The first through-hole 612 has an inner diameter slightly greater (e.g., 0.1 to 5.0 mm) than the outer diameter of the insertion portion 651. The first holder 610 is made of a material, such as quartz or a ceramic, having a heat resistant temperature higher than the temperature (e.g., 600° C.) of the film deposition process performed in the film deposition apparatus 300.

The second holder 620 is provided inside the first holder 610 with a space G21 spaced from an inner wall of the first holder 610. The space G21 may be, for example, 0.1 to 5.0 mm. The second holder 620 has a cylindrical shape with a bottom that has an outer diameter less than the inner diameter of the first holder 610. The second holder 620 includes a contact 621. The contact 621 has an annular shape extending outward from an outer wall of the upper end of the second holder 620 and contacts the upper surface of the flange 404 formed on the stage 410. A second through-hole 622 into which the insertion portion 651 of the shaft 650 is inserted is formed at the bottom of the second holder 620. The second through-hole 622 has an inner diameter that is slightly greater (e.g., 0.1 to 5.0 mm) than the outer diameter of the insertion portion 651. The second holder 620 is made of a material, such as quartz or a ceramic, having a heat resistant temperature higher than the temperature (e.g., 600° C.) of the film deposition process performed in the film deposition apparatus 300. Preferably, the second holder 620 is made of the same material as the first holder 610 with respect to preventing a thermal expansion difference.

As described above, the upper end of the first holder 610 contacts the lower surface of the flange 404 and the contact 621 of the second holder 620 contacts the upper surface of the flange 404 so that the flange 404 is sandwiched by the first holder 610 and the second holder 620.

The pressing member 630 presses the first holder 610 or the second holder 620 in a direction in which the second holder 620 comes closer to the first holder 610. The pressing member 630 is disposed, for example, on the bottom surface inside the second holder 620 to press the bottom of the second holder 620 toward the bottom of the first holder 610. Thus, the flange 404 is sandwiched between the upper end of the first holder 610 and the contact 621 of the second holder 620 and is fixed by the pressing force of the pressing member 630. The pressing member 630 includes, for example, a disk spring.

The lid 640 has a cylindrical shape having an outer diameter substantially the same as the inner diameter of the second holder 620 and is inserted into the second holder 620 to cover an upper opening of the second holder 620. This prevents the pressing member 630 from being exposed to the source gas and the reaction gas. Therefore, when the pressing member 630 is made of a metallic material, corrosion of the pressing member 630 can be suppressed. The lid 640 is made of a material, such as quartz or a ceramic, having a heat resistant temperature higher than the temperature (e.g., 600° C.) of the film deposition process performed in the film deposition apparatus 300.

The shaft 650 is made of, for example, a metallic material and has an insertion portion 651 and a support 652.

The insertion portion 651 is an upper portion of the shaft 650. The insertion portion 651 passes through the first through-hole 612 and the second through-hole 622, and an upper end of the insertion portion 651 is fixed by the pressing member 630 inside the second holder 620. Since the outer diameter of the insertion portion 651 is slightly less than an inner diameter of the first through-hole 612, a space G22 is formed between an outer wall of the insertion portion 651 and an inner wall of the first through-hole 612. Since the outer diameter of the insertion portion 651 is slightly less than the inner diameter of the second through-hole 622, a space G23 is formed between the outer wall of the insertion portion 651 and an inner wall of the second through-hole 622.

The support 652 is a lower portion of the shaft 650. A lower end of the support 652 is fixed to the upper surface of the ceiling 322b of the housing box 322. The insertion portion 651 and the support 652 may be formed separately.

According to the fixing mechanism 600 described above, the rotary table 400 is sandwiched by the first holder 610 and the second holder 620 and the pressing member 630 presses the first holder 610 or the second holder 620 in a direction in which the second holder 620 comes closer to the first holder 610, so that the rotary table 400 is fixed. This can absorb a thermal expansion difference in a state in which a revolving core is exposed. As a result, damage of the rotary table 400 and the fixing mechanism 600 caused by thermal stress can be prevented.

Additionally, according to the fixing mechanism 600, the space G22 and the space G23 are respectively formed between the insertion portion 651 and the first through-hole 612 and between the insertion portion 651 and the second through-hole 622. Thus, when thermal expansion differences are generated between the insertion portion 651 and the first holder 610 and between the insertion portion 651 and the second holder 620, generation of stress on the insertion portion 651, the first holder 610, the second holder 620, and the like can be prevented. As a result, damage of the first holder 610, the second holder 620, the rotary table 400, and the like can be prevented.

Additionally, according to the fixing mechanism 600, the shaft 650 is covered by the first holder 610 and the second holder 620 and is fixed by the pressing force of the pressing member 630 disposed on the bottom surface of the second holder 620. This prevents the shaft 650 from being exposed to the source gas and the reaction gas. As a result, when the shaft 650 is made of a material that can be corroded by the source gas and the reaction gas, corrosion of the shaft 650 can be suppressed.

[Operation of the Rotation Driving Device]

Figure 7:
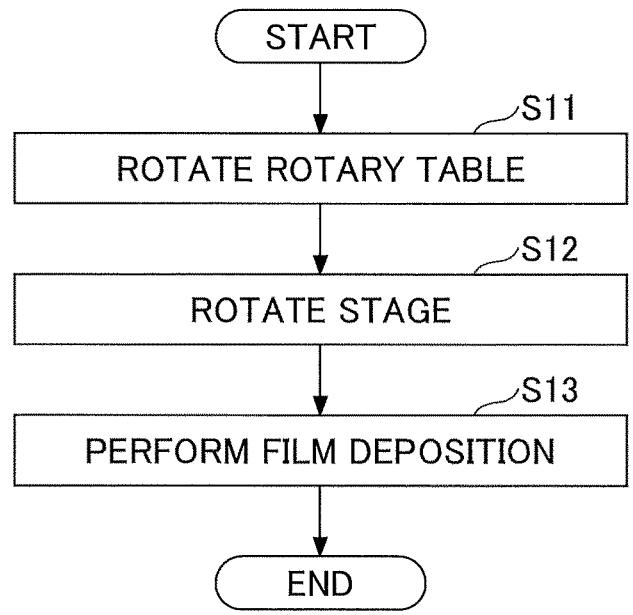
FIG. 7 is a flowchart illustrating an example of an operation of a rotation driving device.

With reference to FIG. 7, an example of an operation of the rotation driving device 320 (i.e., a rotation driving method) will be described. FIG. 7 is a flowchart illustrating an example of the operation of the rotation driving device 320.

In the following, an example in which the controller 390 controls the film deposition apparatus 300 to form a film on a substrate on the stage 321a by using atomic layer deposition (ALD) in a state in which the rotary table 321 and the stage 321a are being rotated will be described. The rotation driving method illustrated in FIG. 7 includes steps S11 to S13.

In step S11, the controller 390 controls the revolution motor 324 to rotate the rotary table 321. This causes the substrates W on the multiple stages 321a provided along the circumferential direction of the rotary table 321 to revolve. The rotational speed of the rotary table 321 may be, for example, 1 to 500 rpm.

In step S12, the controller 390 controls the rotation motor 321c to rotate each of the multiple stages 321a provided along the circumferential direction of the rotary table 321 relative to the rotary table 321. As a result, the substrate W placed on each of the stages 321a rotates. The rotational speed of the stage 321a may be, for example, 1 to 30 rpm.

In step S13, the controller 390 controls the processor 310 and performs a film deposition process on the substrate W. The controller 390, for example, supplies the source gas to the source gas adsorption region P1 from the source gas nozzle 312a and supplies the reaction gas to the reaction gas supply region P2 from the reaction gas nozzle 312b in a state in which the separation gas is supplied from the separation gas nozzles 312c and 312d to the separation region D. Accordingly, when the substrate W placed on the stage 321a of the rotary table 321 repeatedly passes through the source gas adsorption region P1 and the reaction gas supply region P2, a film formed by ALD is deposited on the surface of the substrate W.

According to the above-described rotation driving method, while the substrate W placed on each stage 321a rotates, the substrate W repeatedly passes through the source gas adsorption region P1 and the reaction gas supply region P2 to deposit a film formed by ALD on the surface of the substrate W. This improves the uniformity of the film in the circumferential direction of the substrate W.

According to the above-described rotation driving method, the rotation motor 321c that rotates the stage 321a is disposed inside the housing box 322 separated from the vacuum chamber 311. Thus, particles and the like resulting from mechanical contact, such as contact in bearings contained in the rotation motor 321c can be confined inside the housing box 322. As a result, particles can be prevented from entering a process area. Additionally, since the rotation motor 321c does not contact the source gas and the reaction gas introduced into the vacuum chamber 311, corrosion of the rotation motor 321c caused by the source gas and the reaction gas can be prevented.

Additionally, since the rotation motor 321c can be disposed in a place where the film deposition apparatus 300 is disposed, such as in the housing box 322 that can be maintained to be the same environment as a clean room, rather than in the vacuum environment in the vacuum chamber 311, stable operation of the rotation motor 321c can be achieved. As a result, the stage 321a operated by the rotation motor 321c can accurately rotate.

Figure 8:
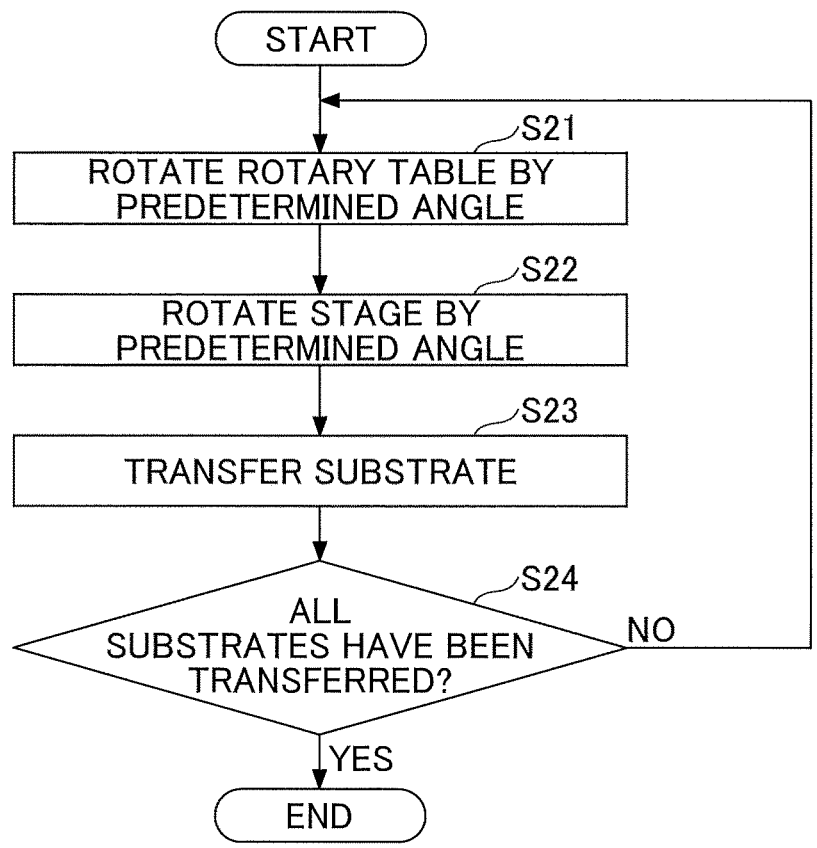
FIG. 8 is a flowchart illustrating another example of the operation of the rotation driving device.

With reference to FIG. 8, another example of the operation of the rotation driving device 320 (i.e., the rotation driving method) will be described. FIG. 8 is a flowchart illustrating another example of the operation of the rotation driving device 320.

In the following, an example in which the controller 390 controls the rotation driving device 320 to rotate the rotary table 321 and the stage 321a and then transfer the substrate W placed on the stage 321a of the rotary table 321 to the outside of the vacuum chamber 311 will be described. The rotation driving method illustrated in FIG. 8 is performed, for example, after the film deposition process is completed for each of the substrates W placed on the multiple stages 321a. The rotation driving method illustrated in FIG. 8 includes steps S21 to S24.

In step S21, the controller 390 controls the revolution motor 324 to rotate the rotary table 321 at a predetermined angle so that one of the multiple stages 321a moves to a position facing the transfer port 314.

In step S22, the controller 390 controls the rotation motor 321c to rotate the stage 321a moved to the position facing the transfer port 314 and rotate the substrate W placed on the stage 321a, so that the substrate W is positioned in the rotational direction.

In step S23, the controller 390 opens a gate valve and transfers the substrate W placed on the stage 321a facing the transfer port 314 to the outside through the transfer port 314 by using the transfer arm 314a from the outside.

In step S24, the controller 390 determines whether all of the substrates W placed on the multiple stages 321a have been transferred. In step S24, if it is determined that all of the substrates W have been transferred, the controller 390 terminates the process. In step S24, if it is determined that all of the substrates W have not been transferred, the controller 390 returns the process to step S21.

According to the above-described rotation driving method, when the substrate W on which the film deposition process has been performed is to be transferred, after the rotary table 321 revolves and the stage 321a rotates, the substrate W placed on the stage 321a of the rotary table 321 is transferred to the outside of the vacuum chamber 11. Thus, the substrate W can be transferred in a state in which the substrate W is positioned in the rotational direction.

According to the above-described rotation driving method, the rotation motor 321c that rotates the stage 321a is disposed inside the housing box 322 separated from the vacuum chamber 311. Thus, particles and the like resulting from mechanical contact, such as contact in bearings contained in the rotation motor 321c can be confined inside the housing box 322. As a result, particles can be prevented from entering the process area. Additionally, since the rotation motor 321c does not contact the gas introduced into the vacuum chamber 311, corrosion caused by the gas can be prevented.

Additionally, since the rotation motor 321c can be disposed in a place where the film deposition apparatus 300 is disposed, such as in the housing box 322 that can be maintained to be the same environment as a clean room, rather than in the vacuum environment in the vacuum chamber 311, stable operation of the rotation motor 321c can be achieved. As a result, the stage 321a operated by the rotation motor 321c can accurately rotate.

The embodiment disclosed here should be considered to be exemplary in all respects and not restrictive. The above embodiment may be omitted, substituted, and modified in various forms without departing from the scope and spirit of the claims.

In the embodiment described above, a case in which five stages 321a are provided on the rotary table 321 has been described, but the present disclosure is not limited to this. For example, the number of the stages 321a may be less than or equal to four and may be greater than or equal to six.

In the embodiment described above, a case in which the processor 310 includes the vacuum chamber 311, the gas introduction port 312, the gas exhaust port 313, the transfer port 314, the heating unit 315, and a cooler 316 has been described, but the present disclosure is not limited to this. For example, the processor 310 may further include a plasma generator that produces a plasma to activate various gases supplied into the vacuum chamber 311.

What is claimed is:

1. An apparatus for substrate processing, the apparatus comprising:
   a vacuum chamber;
   a rotary table that is rotatably provided inside the vacuum chamber;
   a stage that is rotatable with respect to the rotary table, the stage having a center of rotation at a position spaced apart from a center of rotation of the rotary table, and the stage having a flange provided at a lower surface of the stage;
   a first holder and a second holder, the flange being sandwiched between the first holder and the second holder;
   a pressing member configured to press the second holder in a direction in which the second holder comes closer to the first holder, and
   a shaft that rotates the stage with respect to the rotary table,
   wherein an upper end of the first holder overlaps the flange in plan view,
   wherein the first holder has a first through-hole, the shaft has an insertion portion, and the insertion portion of the shaft passes through the first through-hole,
   wherein a first space is formed between an outer wall of the insertion portion and an inner wall of the first through-hole,
   wherein the inner wall of the first through-hole is exposed to the first space,
   wherein the second holder has a second through-hole, and the insertion portion of the shaft passes through the second through-hole,
   wherein a second space is formed between the outer wall of the insertion portion and an inner wall of the second through-hole,
   wherein the inner wall of the second through-hole is exposed to the second space,
   wherein the first holder has a cylindrical shape with a bottom, an upper end of the first holder contacting a lower surface of the flange, and
   wherein the second holder has a cylindrical shape with a bottom, the second holder being provided inside the first holder such that the second holder is spaced apart from an inner wall of the first holder, and the second holder including a contact contacting an upper surface of the flange.

2. The apparatus as claimed in claim 1, wherein the contact has an annular shape extending outward from an outer wall of an upper end of the second holder.

3. The apparatus as claimed in claim 1,
   wherein the first through-hole and the second are respectively formed in the bottom of the first holder and the bottom of the second holder.

4. The apparatus as claimed in claim 1, wherein the pressing member is disposed on the bottom of the second holder inside the second holder and presses the bottom of the second holder toward the bottom of the first holder.

5. The apparatus as claimed in claim 1, further comprising a lid that covers an opening of the second holder.

6. The apparatus as claimed in claim 1, wherein the pressing member includes a disk spring.

7. The apparatus as claimed in claim 1, wherein a material of the shaft is different from a material of the first holder and a material of the second holder.

8. The apparatus as claimed in claim 1,
   wherein an entirety of the inner wall of the first through-hole is exposed to the first space, and
   wherein an entirety of the inner wall of the second through-hole is exposed to the second space.

9. An apparatus for substrate processing, the apparatus comprising:
   a vacuum chamber;
   a rotary table that is rotatably provided inside the vacuum chamber; the rotary table having a flange provided at a lower surface of the rotary table at a position spaced apart from a center of rotation of the rotary table;
   a first holder and a second holder, the flange being sandwiched between the first holder and the second holder;
   a pressing member configured to press the second holder in a direction in which the second holder comes closer to the first holder, and
   a fixing shaft that fixes the rotary table,
   wherein an upper end of the first holder overlaps the flange in plan view,
   wherein the first holder has a first through-hole, the fixing shaft has an insertion portion, and the insertion portion of the fixing shaft passes through the first through-hole,
   wherein a first space is formed between an outer wall of the insertion portion and an inner wall of the first through-hole,
   wherein the inner wall of the first through-hole is exposed to the first space,
   wherein the second holder has a second through-hole, and the insertion portion of the fixing shaft passes through the second through-hole,
   wherein a second space is formed between the outer wall of the insertion portion and an inner wall of the second through-hole,
   wherein the inner wall of the second through-hole is exposed to the second space,
   wherein the first holder has a cylindrical shape with a bottom, an upper end of the first holder contacting a lower surface of the flange, and
   wherein the second holder has a cylindrical shape with a bottom, the second holder being provided inside the first holder such that the second holder is spaced apart from an inner wall of the first holder, and the second holder including a contact contacting an upper surface of the flange.

10. The apparatus as claimed in claim 9, wherein the contact has an annular shape extending outward from an outer wall of an upper end of the second holder.

11. The apparatus as claimed in claim 9,
    wherein the first through-hole and the second through-hole are respectively formed in the bottom of the first holder and the bottom of the second holder.

12. The apparatus as claimed in claim 9, wherein the pressing member is disposed on the bottom of the second holder inside the second holder and presses the bottom of the second holder toward the bottom of the first holder.

13. The apparatus as claimed in claim 9, further comprising a lid that covers an opening of the second holder.

14. The apparatus as claimed in claim 9, wherein the pressing member includes a disk spring.

15. The apparatus as claimed in claim 9, wherein a material of the shaft is different from a material of the first holder and a material of the second holder.

16. The apparatus as claimed in claim 9,
wherein an entirety of the inner wall of the first through-hole is exposed to the first space, and
wherein an entirety of the inner wall of the second through-hole is exposed to the second space.

\* \* \* \* \*